United States Patent Office 3,218,170 Registered Nov. 16, 1965

3,218,170

PHOTOPOLYMERIZABLE COMPOSITIONS AND PROCESSES

Robert Haun Beck, Fairhaven, and Charles Walter Smith, Red Bank, N.J., assignors to E. I. du Pont de Nemours and Company, Wilmington, Del., a corporation of Delaware No Drawing. Filed Feb. 5, 1964, Ser. No. 342,769
5 Claims. (Cl. 96—115)

This application is a continuation-in-part of our copending application, Ser. No. 219,101, filed Aug. 29, 1962, now abandoned.

This invention relates to improved addition polymerizable compositions and to processes of preparing such compositions.

Photopolymer printing plates are now being used rather extensively in the printing industry. Such plates are obtained by exposing, imagewise, an element having a light-sensitive layer comprising a polymerizable monomer and a suitable photoinitiator for the polymerization reaction. Under the influence of actinic radiation, the photoinitiator becomes activated and induces the polymerization of the monomer; thus, the exposed element comprises polymerized and unpolymerized areas in imagewise distribution corresponding to the light and dark areas, respectively, of the master used for the exposure. Treatment with a suitable solvent that dissolves the unpolymerized material in the unexposed areas but not the polymer in the exposed image areas results in a relief plate.

For letterpress printing, photopolymer printing plates require a relief image, the raised areas of which are inked and pressed against a suitable surface, e.g., a sheet of paper, thus giving a print. Such photopolymer printing plates have now achieved a high quality standard. Excellent such compositions and photopolymerizable elements are disclosed in U.S. patents Plambeck 2,760,863 and 2,791,504, Martin 2,927,022, 2,927,023 and 2,902,365, Barney 2,948,611 and Saner and Burg 2,972,540. The preferred compositions comprise a polymerizable monomer, a photoinitiator and an organic polymer binder or filler, preferably a cellulose mixed ester, e.g., cellulose acetate hydrogen succinate. Suitable such compositions can be prepared according to Munger, U.S. 2,923,673 and Smith, U.S. 3,012,952.

A practical method of preparing photopolymerizable elements using the compositions of the above-mentioned patents consists of calendering the composition at elevated temperature to form a sheet of uniform thickness. Subsequently, this sheet is laminated to a suitable support, e.g., steel, aluminum, plastic, cardboard, etc., or the material can be calendered directly onto a support.

In order to perform a successful calendering operation, the composition should have adequate plasticity at elevated temperature. A composition having a low degree of plasticity tends to form a non-coherent, crumbly mass rather than a homogeneous mass in the nip of the calender. With a crumbly mass, the resulting sheet is likely to have imperfections in the form of pits and areas of non-uniform thickness.

Another defect occurring in calendered photopolymer sheets is the presence of small, shallow, surface depressions or "troughs." The latter are associated with rupturing of the outer strata of the mass, or "bank," of photopolymerizable material which is always under tension and undergoes continuous elongation because of the pattern of polymer flow at the nip of the calender roll. If the polymer banks are smooth and free of ruptures, "troughs" do not occur.

It is an object of this invention to provide photopolymerizable compositions of improved calenderability. A further object is to provide such compositions that are simple to prepare and utilize readily available chemical adjuvants. Still further objects will be apparent to those skilled in the art from the following detailed description of the invention.

The photopolymerizable compositions and elements of this invention comprise, by weight, (1) 10 to 60 parts of an addition polymerizable, non-gaseous, ethylenically unsaturated compound containing at least one terminal ethylenic group ($CH_2{=}C{<}$), having a boiling point above 100° C. at normal atmospheric pressure and being capable of forming a high polymer by free-radical initiated chain-propagating addition polymerization, and preferably a molecular weight of not more than 1500, (2) 40 to 90 parts of cellulose acetate hydrogen succinate, having a degree of acetyl substitution from 1.5 to 2.45 and of hydrogen succinate substitution from 0.4 to 1.0, (3) 0.1 to 10, preferably 0.3 to 6, parts of an aliphatic carboxylic acid taken from the group consisting of adipic, citric, diglycollic, glutaric, glycollic, lactic, maleic, malic and sebacic acids, said acid being different from the acid radical of said ester. Mixtures of two or more such acids can be used.

In addition to the constituents just listed, the photopolymerizable compositions may contain (4) 0.001 to 10 percent by weight of components (1) and (2) of a free-radical generating addition polymerization initiator activatable by actinic radiation, and (5) A thermal addition polymerization inhibitor in an amount of 0.001 to 6 percent by weight of component (1).

The calendering process of this invention comprises forming a photopolymerizable composition as described above into a sheet and calendering the sheet at a temperature from about 70° C. to about 120° C.

The compositions can be made by merely uniformly admixing the constituents described above. Preferred compositions can be made by the processes described in Smith U.S.P. 3,012,952 or Munger U.S.P. 2,923,673 by melt succinylation of cellulose acetate with succinic anhydride in the presence of an esterification catalyst, a monomeric compound, a photoinitiator and a thermal polymerization inhibitor, the organic acid constituents of this invention preferably being added to the photopolymerizable composition at the end of the succinylation process, and before calendering the photopolymerizable composition to form a sheet or layer. This can be done by adding the required amount of the organic acid constituent (3) to the composition, while milling on a suitable mill for about 5 to 10 minutes at about 85° C. to about 150° C. However, the organic acid can also be added during or at the beginning of the succinylation reaction.

Free succinic acid, although it has a plasticizing action on the photopolymerizable composition, has a low solubility in the plastic mass and tends to crystallize in the finished photopolymerizable plate upon storage. This defect manifests itself by the formation of so-called "bloom" on the plate surface. Other acids have an adverse effect on the adhesive layer between the metal support plate and the photopolymerizable layer, or may diffuse through the adhesive layer and attack the metal support plate. Still other acids may lead to spontaneous polymerization of the composition. However, the constituent (3) acids listed above overcome the disadvantages just mentioned, and have other advantages over the aforesaid other acids including sulfuric, acetic or oxalic acids.

Bloom can be reduced or overcome by applying a protective strippable membrane or film, e.g., 1-mil polyethylene terephthalate, to the surface of the photopolymerizable layer as described in Plambeck U.S.P. 2,760,863.

The following examples serve to illustrate the invention but the invention is not limited to them.

*Example I*

A photopolymerizable composition was made according to Smith, U.S. 3,012,952 using the following ingredients:

| | G. |
|---|---|
| Cellulose acetate | 2400 |
| Polyethylene glycol diacrylate | 1680 |
| Succinic anhydride | 910 |
| p-Methoxyphenol | 6.72 |
| 2-ethylanthraquinone | 6.72 |

The cellulose acetate had a degree of acetyl substitution of 1.85 and was finely pulverized so that the particles passed through a screen having 0.010 inch openings. The polyethylene glycol diacrylate was prepared from a dial precursor having an average molecular weight of 300.

These ingredients were mixed intimately for 5 minutes in a planetary mixer, then transferred to a two-roll rubber mill the rolls of which measured 20 inches in length and 10 inches in diameter and were preheated to 135° C. by means of steam.

The mixture was milled for 10 minutes at 135° C. roll temperature in order to achieve a uniform mass and to drive out any moisture. After this time, 160 ml. of diethylcyclohexylamine were added to the mass while milling. The milling was continued for another 15 minutes, during which time the succinylation reaction took place and the temperature of the mass rose to 140–150° C. A small sample was then taken and the degree of succinyl substitution on the cellulose acetate determined as in Example I of Smith, U.S. 3,012,952. The succinyl substitution was 0.81.

At the end of the 15 minute reaction period, 160 g. of dry glutaric acid were added to the reaction mass while still on the mill and the milling continued for another 5 minutes.

The final photopolymerizable composition was then removed from the rubber mill and placed on a four-roll, inverted L calender the rolls of which measured 16 inches in length and 8 inches in diameter and were kept at a temperature of 105–110° C. and calendered at a speed of 6 feet per minute. A 0.015 inch thick sheet was formed and laminated to an adhesive coated 0.012 inch thick steel support by rolling under pressure at room temperature, and then cured in an oven at about 120° C. The adhesive composition was that described in Example 5 of Burg, U.S. Patent No. 3,036,913.

The physical properties of the photopolymerizable composition were excellent during calendering. The bank rotated freely and the calendered sheet had no surface defects or "troughs."

The laminated, photopolymerizable element was placed in a vacuum frame, and the polymer surface was brought in contact with a photographic process negative having line and halftone areas. The evacuated vacuum frame containing the plate and negative was placed beneath a 1800-watt high pressure mercury arc light source and the plate exposed to 1.75 watts of actinic radiation per square inch for 14 seconds. After exposure, the negative was stripped from the plate and the unexposed areas of the plate removed by spray washing for 5 minutes with a 0.04 N aqueous solution of NaOH. A clear relief image, bonded firmly to the base and corresponding to the clear areas of the negative was obtained. The printing plate thus obtained showed excellent image quality and long press life when used for printing on a flat bed press.

A control plate made by the same procedure and using the same ingredients, except that the glutaric acid addition was omitted, showed surface defects. In the calender, the bank did not rotate freely and the resulting polymer sheet had many shallow surface depressions or "troughs." After exposure and washout, the resulting printing plate had an equally good press life, but the surface defects led to imperfections in the printed image.

*Example II*

Example I was repeated, except that the glutaric acid calendering aid was replaced by the same amount of dry glycolic acid. Similar favorable physical properties were observed and printing plates made from this composition were of high quality.

*Example III*

Two photopolymerizable compositions were made, one exactly as described in Example I, containing about 3% by weight of glutaric acid, the other containing the same amount of succinic acid. Both compositions calendered perfectly and did not give any surface defects when laminated to a support. Upon storage for three weeks, however, the plate containing succinic acid showed "bloom" on the plate surface, i.e., crystallized succinic acid. The plate containing glutaric acid showed no "bloom" after 4 months' storage.

*Example IV*

Example I was repeated, except that the glutaric acid calendering aid was added to the initial reaction mixture before the succinylation reaction took place. The results were identical with those of Example I.

*Example V*

Example II was repeated, except that the glycolic acid was added to the reaction mixture before the succinylation reaction took place. The results were identical with those of Example II.

*Example VI*

Three photopolymerizable compositions were made following the procedure of Example I, except that the glutaric acid was replaced by the following organic acids: 2.5% by weight of maleic acid, 3.3% of citric acid, 3.3% of lactic acid. The three compositions could be milled and calendered easily and the laminated photopolymerizable plates had good surface characteristics. No "bloom" developed after four months' storage and satisfactory relief printing plates were prepared.

*Example VII*

A photopolymerizable composition was made according to Smith U.S.P. 3,012,952 using the following ingredients:

| | Grams |
|---|---|
| Cellulose hydroacetate | 2400 |
| Triethylene glycol diacrylate | 1715 |
| Succinic anhydride | 925 |
| p-Methoxyphenol | 6.86 |
| 2-ethylanthraquinone | 6.86 |
| Adipic acid | 51 |

The cellulose hydroacetate had a degree of acetyl substitution of 1.90 and was finely pulverized so that the particles passed through a screen having 0.01 inch openings. The triethylene glycol diacrylate was prepared from a diol precursor having a molecular weight of 150.2.

These ingredients were mixed intimately for 5 minutes in a planetary mixer, then transferred to a two-roll rubber mill, the rolls of which measured 20 inches in length and 10 inches in diameter and were preheated to 130° C. by means of steam.

The mixture was milled for 10 minutes at 130° C. roll temperature in order to achieve a uniform mass and to drive out any moisture. Then, while milling, 160 ml. of diethylcyclohexylamine was added to the mass. The milling was continued for 12 minutes, during which time the succinylation reaction took place. The succinyl substitution on the cellulose hydroacetate was determined to be 0.72.

The final photopolymerizable composition was then removed from the rubber mill and granulated to provide feed for an inverted L calender. The rolls of the calender were 16 inches in length and 8 inches in diameter and were kept at a temperature of 85–90° C. A 0.045-inch thick sheet was formed and combined at room temperature to an adhesive coated 0.103-inch thick aluminum support.

A control composition made by the same procedure and using the same ingredients, except that the adipic acid addition was omitted, showed surface defects. In the calender, the banks did not rotate freely and the resulting polymer sheet had many shallow surface depressions or "troughs." During calendering, the physical properties of the adipic acid-modified composition were excellent. The bank rotated freely and the calendered sheet had no surface defects or "troughs."

Another control composition made by the same procedure and using the same ingredients, except that the adipic acid addition was replaced by an equal amount of glutaric acid addition, showed freedom from surface defects. The physical properties of the glutaric acid composition during calendering were similar to the adipic acid composition.

By using 1 part of malic or sebacic acid per 100 parts by weight of the photopolymerizable mixture of Example VII, calenderability was improved and the photopolymerizable characteristics were not reduced.

The following example (VIII) was designed to accurately determine the effects of different acids on polymer composition during processing, calendering and in-use characteristics of plates, by minimizing effect of initial polymer composition. A uniform blend of granules was used as a source of photopolymer which prior to addition of acid would provide polymers having equivalent compositions.

*Example VIII*

Two 50-lb. millings were prepared as in Example I without the addition of acid (ingredients scaled up to yield total mass of 50 lbs.) and subsequently blended in a five-cubic foot capacity twin shell blender. The blend contained 1.18% succinic acid formed during the millings. From this blend five 20-lb. batches of polymer were prepared; each consisting of 20 lbs. of blend plus 54 gms. of either glutaric, adipic, maleic, citric or succinic acid. The acids were dispersed uniformly in each of the blends by milling the mass at 130° C. for 15 minutes on a 10 by 20-inch rubber mill.

Each of the blends was then granulated to provide feed to a 24 by 54-inch calender, the rolls being held at 90° C. A 0.045-inch sheet was formed and combined at room temperature to an adhesive coated .103-inch aluminum support. All of the five compositions were equivalent in calendering performance producing "trough"-free sheeting.

The types and amounts of organic acid calendering aids of this invention are particularly useful for the specific photopolymerizable compositions characterized as comprising the following ingredients:

(1) From 40 to 90 parts by weight of a preformed macromolecular polymer binding agent, specifically cellulose acetate succinate having a degree of acetyl substitution of about 1.85 and of succinyl substitution of about 0.5 to 0.9;

(2) From 10 to 60 parts by weight of a non-gaseous, addition polymerizable ethylenically unsaturated compound, specifically polyethyleneglycol diacrylate prepared from a diol precursor of average molecular weight of 300 to 600.

The compositions contain preferably from 0.001 to 10 parts by weight of an addition polymerization initiator activatable by actinic radiation and inactive thermally below 185° C. The preferred initiators are those of Notley, U.S. Patent No. 2,951,758.

The preferred thermal polymerization inhibitor is p-methoxyphenol, present in an amount of 0.001 to 6% by weight based on the weight of the ethylenically unsaturated compound. Other suitable inhibitors include hydroquinone and alkyl- and aryl-substituted hydroquinones, tert-butyl-catechol, pyrogallol, copper resinate, naphthylamines, β-naphthol, cuprous chloride, 2,6-di-tert-butyl-p-cresol, phenothiazine, pyridine, nitrobenzene and dinitrobenzene. Other useful inhibitors include p-toluquinone and chloroanil, and thiazine dyes, e.g., Thionine Blue G (C.I. 52025), Methylene Blue B (C.I. 52015) and Toluidine Blue O (C.I. 52040).

A suitable esterification catalyst in carrying out the succinylation reaction is diethylcyclohexylamine. Other esterification catalysts, which can be added in amounts up to 20% based on the weight of the reactants, are those disclosed in Smith, U.S. Patent No. 3,012,952, i.e., pyridine, triethylamine, tributylamine, triamylamine, trimethylamine acetate and pyridine acetate. In addition, an inorganic catalyst may be used, such as sodium carbonate, sodium phosphate, sodium borate, sodium acetate, lithium acetate, calcium acetate, potassium acetate, magnesium acetate and potassium carbonate.

This invention is useful for the preparation of photosensitive, addition polymerizable compositions, said compositions being particularly well suited for the preparation of photopolymerizable printing elements, e.g., printing reliefs, after the manner disclosed in Plambeck, U.S. Patent No. 2,760,863.

The compositions of this invention are also useful in elements for thermal transfer processes as described in assignee's Burg and Cohen U.S. Patents 3,060,225, 3,060,024 and 3,060,023, and U.S. application Serial No. 163,078 filed December 29, 1961.

They are further useful for affixing phosphors to surfaces to provide color television screens and for forming printed circuit diagrams.

This invention shows advantages and progress over the prior art procedures of making photopolymerizable compositions. It provides photopolymerizable compositions of improved calenderability, thus giving photopolymerizable printing plates of excellent surface characteristics. This, in turn, results in higher quality prints obtainable from such printing plates. Still other advantages will be apparent to those skilled in the art from the foregoing description.

We claim:

1. A photopolymerizable composition comprising, by weight, (1) 10 to 60 parts of an addition polymerizable, nongaseous, ethylenically unsaturated compound containing at least one terminal ethylenic group $$(CH_2{=}C{<})$$

having a boiling point above 100° C. at normal atmospheric pressure and being capable of forming a high polymer by free-radical initiated chain-propagating addition polymerization, and a molecular weight of not more than 1500, (2) 40 to 90 parts of cellulose acetate/hydrogen succinate having a degree of acetyl substution of 1.5 to 2.45 and of hydrogen succinate substitution of 0.4 to 1.0, (3) from 0.1 to 10.0 parts of an aliphatic carboxylic acid taken from the group consisting of adipic, citric, diglycollic, glutaric, glycollic lactic, maleic, malic and sebacic acids, said acid being different from the acid radical of said ester.

2. A photopolymerizable composition according to claim 1 containing an addition polymerization initiator and a thermal addition polymerization inhibitor.

3. A photopolymerizable composition according to claim 1 wherein said acid is glutaric acid.

4. A photopolymerizable composition according to claim 1 wherein said acid is adipic acid.

5. A process which comprises forming a photopolymerizable composition as defined in claim 1 into a sheet and calendering the sheet at a temperature of from about 70° C. to about 120° C.

No references cited.

NORMAN G. TORCHIN, *Primary Examiner.*